United States Patent

Stevenson et al.

(10) Patent No.: US 8,324,515 B2
(45) Date of Patent: Dec. 4, 2012

(54) HOUSINGS FOR ELECTRONIC COMPONENTS

(75) Inventors: James F. Stevenson, Morristown, NJ (US); David C. Vacanti, Renton, WA (US); Siu-Ching D. Lui, Bridgewater, NJ (US)

(73) Assignee: Honeywell International Inc., Morristown, NJ (US)

( * ) Notice: Subject to any disclaimer, the term of this patent is extended or adjusted under 35 U.S.C. 154(b) by 1449 days.

(21) Appl. No.: 11/873,303

(22) Filed: Oct. 16, 2007

(65) Prior Publication Data

US 2009/0095523 A1 Apr. 16, 2009

(51) Int. Cl.
*H01L 23/06* (2006.01)
*B32B 3/00* (2006.01)
*B32B 27/04* (2006.01)

(52) U.S. Cl. ........... 174/565; 442/59; 442/131; 442/136
(58) Field of Classification Search .................. None
See application file for complete search history.

(56) References Cited

U.S. PATENT DOCUMENTS

| | | | |
|---|---|---|---|
| 3,264,073 A | 8/1966 | Schmitt | |
| 3,490,983 A * | 1/1970 | Lee | 428/113 |
| 3,951,904 A | 4/1976 | Tomonaga | |
| 4,180,211 A | 12/1979 | Olcott et al. | |
| 4,189,618 A | 2/1980 | Bretts et al. | |
| 4,212,693 A * | 7/1980 | Saito et al. | 156/173 |
| 4,312,912 A | 1/1982 | Tamura | |
| 4,401,495 A | 8/1983 | McKinney | |
| 4,404,053 A * | 9/1983 | Saffire | 156/86 |
| 4,530,949 A | 7/1985 | Atkinson et al. | |
| 4,556,439 A | 12/1985 | Bannink, Jr. | |
| 4,624,798 A | 11/1986 | Gindrup et al. | |
| 4,861,643 A | 8/1989 | Scollard | |
| 4,876,050 A | 10/1989 | Horton | |
| 5,089,326 A | 2/1992 | Bonazza | |
| 5,100,726 A | 3/1992 | Nakagawa | |
| 5,112,667 A * | 5/1992 | Li et al. | 428/113 |
| 5,245,779 A * | 9/1993 | Suzue et al. | 43/18.5 |
| 5,334,414 A | 8/1994 | Edie et al. | |
| 5,399,295 A | 3/1995 | Gamble et al. | |
| 5,414,395 A * | 5/1995 | Garnto et al. | 335/18 |
| 5,538,769 A * | 7/1996 | Sandman, Jr. | 428/36.3 |
| 5,700,342 A | 12/1997 | Giannetti | |
| 5,786,785 A | 7/1998 | Gindrup et al. | |
| 5,827,585 A | 10/1998 | Giannetti | |
| 5,892,476 A | 4/1999 | Gindrup et al. | |
| 5,914,163 A | 6/1999 | Browne | |
| 5,979,826 A * | 11/1999 | Brown et al. | 244/121 |
| 6,259,394 B1 | 7/2001 | Murase et al. | |

(Continued)

FOREIGN PATENT DOCUMENTS

EP 0109505 5/1984

OTHER PUBLICATIONS

Hahn; Microwave Absorbing Material; United States Statutory Invention Registration; Reg. No. H1002; Published Dec. 3, 1991.

*Primary Examiner* — Camie Thompson
(74) *Attorney, Agent, or Firm* — Lowe Graham Jones PLLC

(57) ABSTRACT

Housings for electrical or electronic components made using braid or woven fabric sheets having multiple sections treated with different materials as well as processes and materials for making such housings are disclosed.

8 Claims, 10 Drawing Sheets

U.S. PATENT DOCUMENTS

| | | |
|---|---|---|
| 6,365,257 B1 | 4/2002 | Hecht |
| 6,403,504 B1 | 6/2002 | McMahon et al. |
| 6,410,847 B1 | 6/2002 | Allen et al. |
| 6,530,865 B2 | 3/2003 | Held |
| 6,620,475 B1 * | 9/2003 | Reynolds et al. ............ 428/36.3 |
| 6,638,466 B1 | 10/2003 | Abbott |
| 6,786,771 B2 | 9/2004 | Gailus |
| 6,838,120 B2 | 1/2005 | Kim et al. |
| 7,028,553 B2 | 4/2006 | Smith et al. |
| 7,869,216 B2 * | 1/2011 | Stevenson et al. ............ 361/708 |
| 2005/0074593 A1 | 4/2005 | Day et al. |
| 2005/0263456 A1 | 12/2005 | Cooper et al. |
| 2006/0180264 A1 | 8/2006 | Kisch et al. |
| 2007/0006880 A1 | 1/2007 | Smith et al. |
| 2009/0095523 A1 | 4/2009 | Stevenson et al. |
| 2010/0178487 A1 * | 7/2010 | Arai et al. .................. 428/300.1 |

* cited by examiner

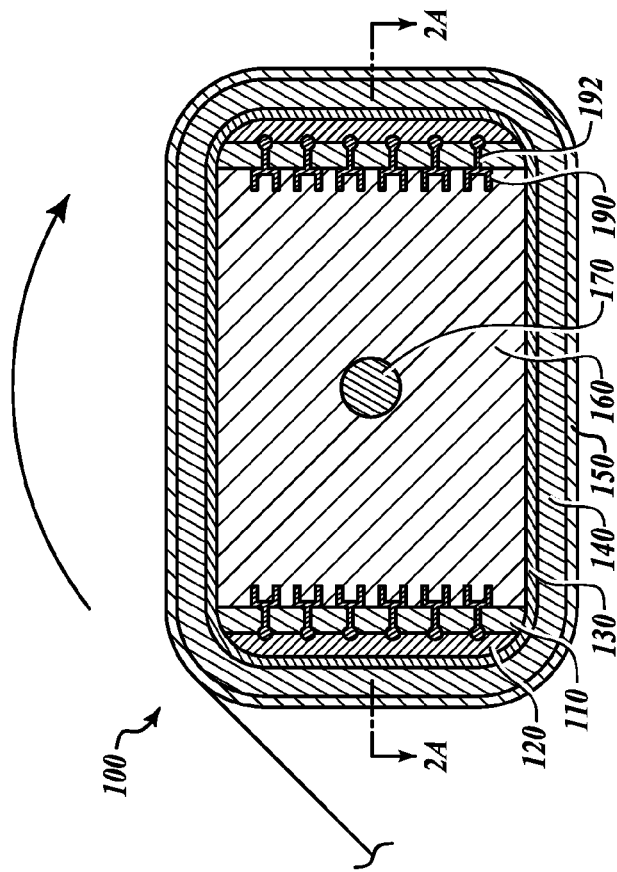
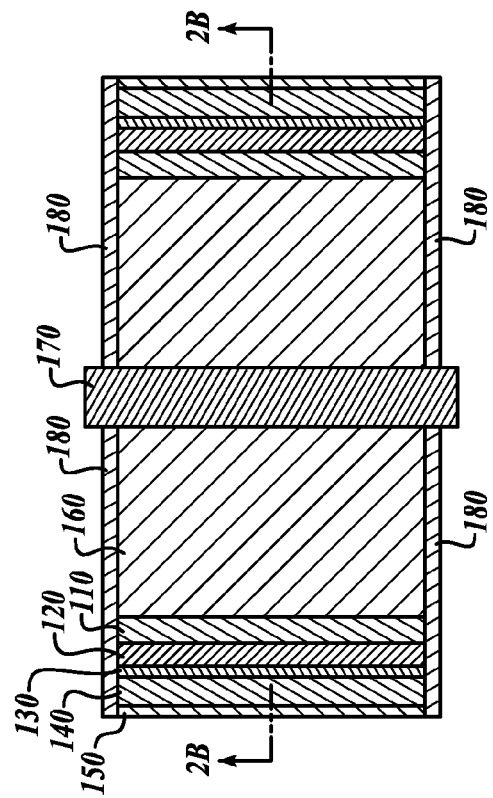
FIG.2B
FIG.2A

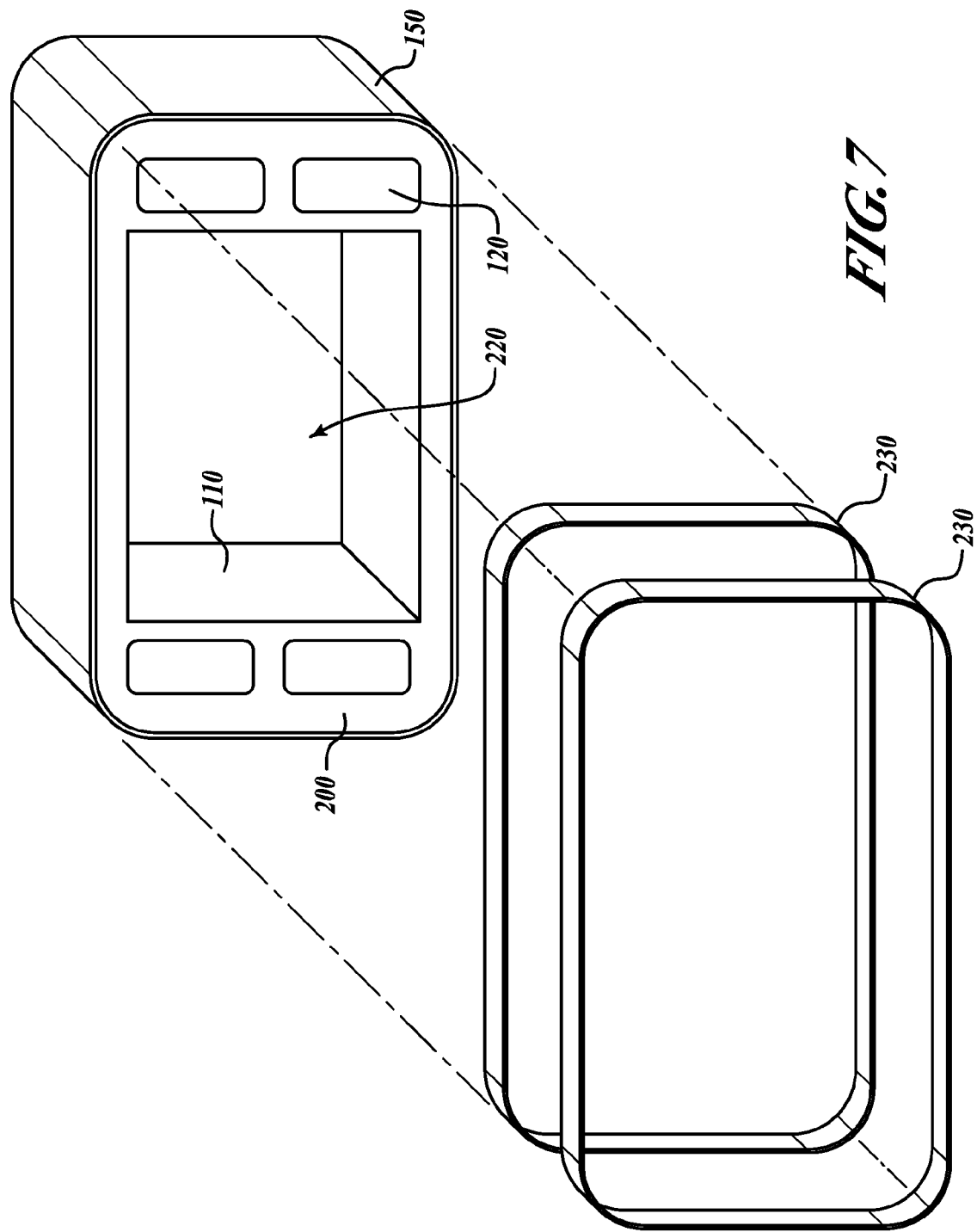

HOUSINGS FOR ELECTRONIC COMPONENTS

BACKGROUND OF THE INVENTION

Housings for electric and electronic components, in addition to having mechanical properties sufficient to support internal components and resist external force, must in some instances also provide shielding from electromagnetic radiation in order to ensure proper functioning of the electronic components. In many cases, it is also necessary for electronic housings to facilitate the removal of heat generated by the electronics. For these reasons, housings are often made of metal to provide the necessary strength, electromagnetic radiation shielding and heat removal capability. However, metal housings have the disadvantage of being relatively heavy and, if machining is involved, relatively expensive to manufacture.

Accordingly, there is a need for light weight housings for electrical or electronic components that provide shielding from electromagnetic radiation, facilitate heat removal, and have sufficient strength to safely house the electrical or electronic components, as well as suitable materials and processes for the construction of such housings.

SUMMARY OF THE INVENTION

Housings for electrical or electronic components made using reinforced fabric sheets having multiple sections treated with different materials as well as processes and materials for making such housings are disclosed. For purposes of describing embodiments of the present invention, reinforced fabric sheets having multiple sections treated with different materials are sometimes referred to hereinafter as "multimaterial prepreg sheets" and housings for electric or electronic components are sometimes referred to hereinafter as "electronic chassis."

In one embodiment of the present invention, a process for making an electronic chassis using a multimaterial prepreg sheet is disclosed comprising: providing a frame; positioning within the frame a mandrel having a rotating shaft and one or more components that will become portions of the electronic chassis; providing a multimaterial prepreg sheet which comprises a braid or woven fabric sheet of a predetermined length and width having a first section treated with a first material, a second section treated with a second material and one or optional additional sections treated with one or more optional additional materials; and rotating the mandrel and the frame using the rotating shaft and applying thereto the multimaterial prepreg sheet such that each section of the prepreg sheet is positioned on the region of the mandrel at which the chassis requires the functionality provided by that section of the multimaterial prepreg sheet. The different material sections of the sheet may be located axially along the length of the sheet, transversely over the width of the sheet or a combination of axial and transverse locations. Once wrapping of the mandrel with the multimaterial prepreg sheet is complete, one or more additional wraps of an enclosing material, such as a silicone rubber sheet, are applied to secure and pressurize the wrapped mandrel during cure. Alternatively the wrapped mandrel can be placed in a sectioned mold which is closed. If additional pressure on the interior surfaces of the wrapping is required, the pressure can be generated by first wrapping an elongated bag around the mandrel and then injecting gas to partially inflate the bag and push the wrap against the exterior wall. Thus secured, the wrapped prepreg material is then cured in an oven at atmospheric pressure or an autoclave under pressure.

In certain embodiments, a first section is treated with a material which provides shielding from electromagnetic radiation, a second section is treated with a material which provides structural integrity and a third section is treated with a material which provides a protective exterior surface. In other embodiments, a cold wall plate and an adjacent open structured layer for heat transfer are prepositioned on the mandrel prior to wrapping the frame with the multimaterial prepreg sheet. In additional embodiments, the frame includes openings for fluid entry to remove heat from the cold wall plate, a conduit adapted for attachment of a door and brackets for anchoring line removable units (LRUs) or circuit boards. In further embodiments, in order to facilitate heat removal, the cold plate is formed from a highly thermally conductive material such that certain surfaces of the cold wall plate are connected by a highly thermally conductive pathway to external heat sinks, such a fins or metal structures.

In another embodiment of the present invention, an electronic chassis made using a multimaterial prepreg sheet is provided comprising a frame having positioned therein one or more components and a multimaterial prepreg sheet which comprises a braid or woven fabric sheet of a predetermined length and width having a first section treated with a first material, a second section treated with a second material and one or more optional additional sections treated with one or more optional additional materials, wherein each section of the multimaterial prepreg sheet corresponds to one or more layers around the mandrel.

In a further embodiment of the present invention, a multimaterial prepreg sheet is provided comprising a braid or woven fabric sheet of a predetermined length and width having a first section treated with a first material, a second section treated with a second material and one or more optional additional sections treated with one or more optional additional materials. The materials or matrix compounds impregnated into the fabric or braid contain a thermoset resin and generally one or more additives to provide specific properties to the prepreg.

In an additional embodiment of the present invention, a process for making a multimaterial prepreg sheet is disclosed comprising the steps of: providing a braid or woven fabric sheet of a predetermined length and width; applying a first material to a first section of the braid or woven fabric sheet of a predetermined length; applying a second material to a second section of the braid or woven fabric sheet of a predetermined length; and optionally applying one or more optional additional materials to one or more optional additional sections of the braid or woven fabric sheet of a predetermined length.

As will be readily appreciated from the foregoing summary, the invention provides housings for electrical or electronic components that provide shielding from electromagnetic radiation, means for facilitating heat removal, and sufficient mechanical integrity to safely house the electrical or electronic components; these housings are of lighter weight and may be more easily manufactured than previously used housings

BRIEF DESCRIPTION OF THE DRAWINGS

Preferred and alternative embodiments of the present invention are described in detail below with reference to the following drawings.

FIGS. 1A and 1B are perspective views illustrating an apparatus and method for producing multimaterial prepreg sheets by impregnating films of matrix compounds into a fabric for the construction of housings for electrical or electronic components, while FIG. 2 shows two sectional views illustrating an electronic chassis made by wrapping a mandrel with a multimaterial prepreg sheet in accordance with an embodiment of the present invention; FIG. 7 is an exploded view of a completed electronic chassis and brackets for mounting the electronic chassis to a desired structure.

DETAILED DESCRIPTION OF THE PREFERRED EMBODIMENT

Figure 1A:
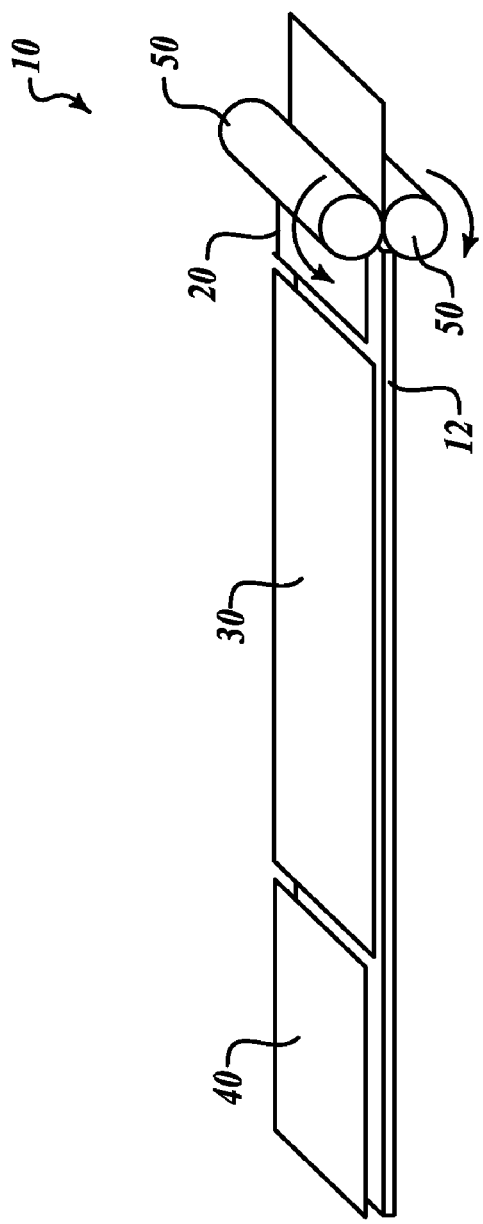
Figure 1B:
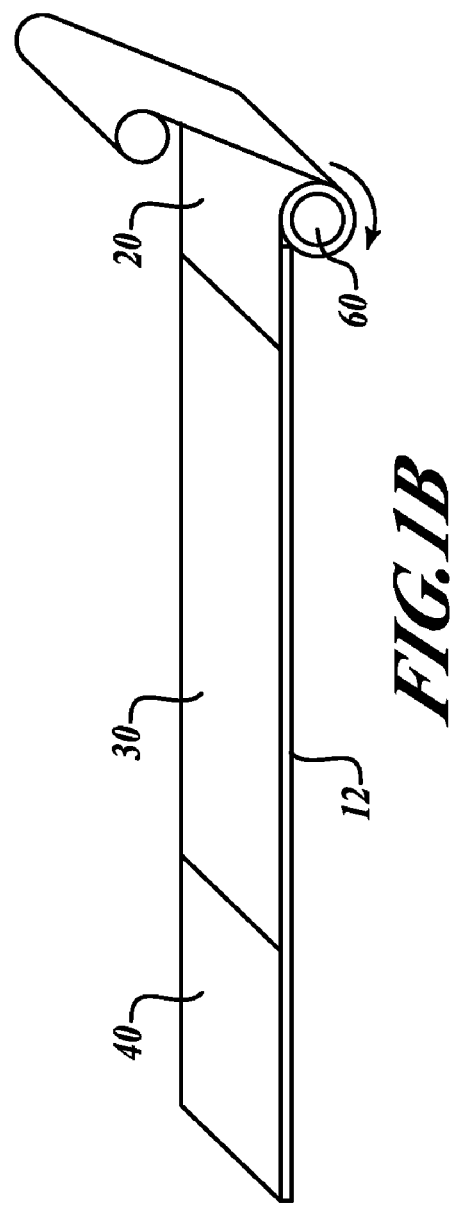
Figure 1C:
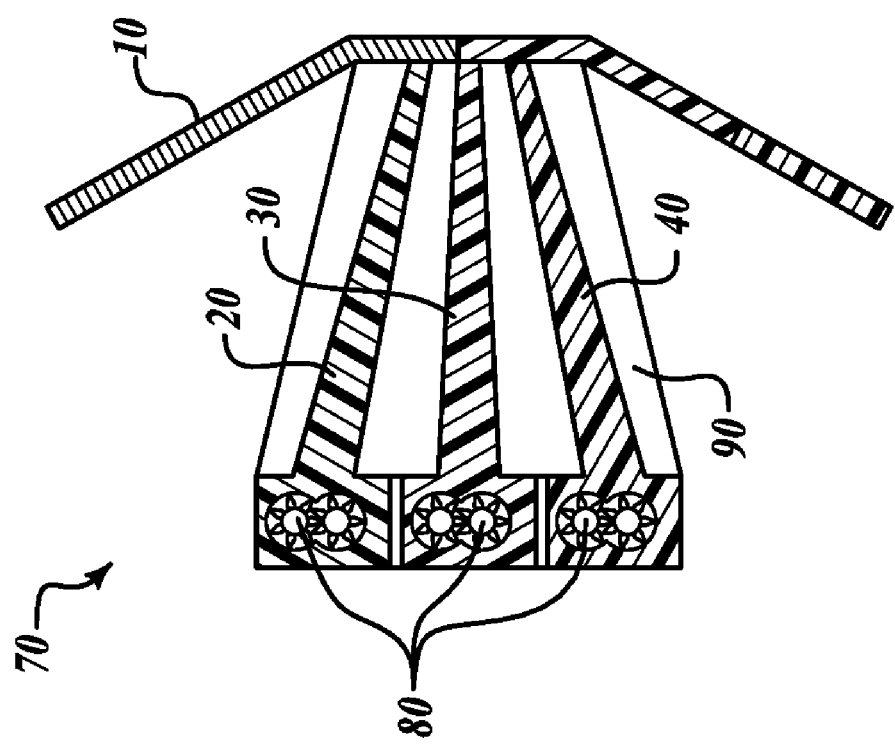
FIG. 1C shows a cut away view of a sheet die for impregnating three matrix compounds into the fabric, in accordance with the present invention.

Referring now to FIGS. 1A and B, an embodiment of an apparatus and method for producing a multimaterial prepreg sheet 10 for the construction of housings for electrical or electronic components in accordance with an embodiment of the present invention is shown and described. An untreated braid or woven fabric sheet of a predetermined length and width is first supplied using a conveying device 12. Predetermined lengths of the untreated braid or woven fabric sheet are then treated with a first material, a second material and an optional third material to produce the multimaterial prepreg sheet 10 having a first section 20 treated with the first material, a second section 30 treated with the second material and, as illustrated, an optional third section 40 treated with the optional third material. The multimaterial or fabric prepreg sheet 10 is then consolidated between hot rollers 50 and collected onto a roll 60 for further processing. In the embodiment shown in FIGS. 1A and B, the materials are applied as compounded polymer or polymer coated metal films which are subsequently melted and impregnated into the sheet. In an alternative embodiment 70 shown in FIG. 1C, adjacent wide slit dies 90 sequentially dispense hot melts of three different materials onto three different sections of a moving untreated braid or woven fabric sheet to form the first section 20, the second section 30 and the third section 40 of the multimaterial prepeg sheet 10. The different materials may be pressurized by gear pumps 80, as shown, or extruders, or other means for metered pumping.

It should be understood that various materials can be used to treat the untreated braid or woven fabric sheet in order to produce the multimaterial prepreg sheet 10 having the desired characteristics. For example, in one embodiment, the first section 20 is treated with a material which provides shielding from electromagnetic radiation, the second section 30 is treated with a material which provides structural integrity and the third section 40 is treated with a material which provides a protective exterior surface. As discussed in more detail below, an epoxy with a low viscosity to facilitate mixing is used to apply the desired matrix material to the untreated braid or woven fabric sheets Referring now to FIG. 2, two sectional views are shown illustrating an embodiment of an electronic chassis 100 made by wrapping a mandrel 160 with a multimaterial prepreg sheet. The electronic chassis 100 is comprised of multiple layers 110, 120, 130, 140 and 150 positioned around a split mandrel 160 which rotates on a shaft 170. The mandrel 160 is sectioned into multiple parts to facilitate removal. Cover plates 180 are positioned on the ends of the mandrel 160 to provide a mounting surface for the front and back covers of the electronic chassis 100 and provide a boundary surface for the multimaterial prepreg sheet. Brackets 190 for anchoring line removable units (LRUs) or circuit boards may be inserted into the mandrel 160. The brackets 190 may optionally include an anchor 192 which extends through the first layer 110 of the electronic chassis 100.

In the embodiment shown in FIG. 2, the layer 110 is a cold wall plate. The cold wall plate may be made of aluminum or highly conductive graphitic carbon which may also be clad in metal. Preferred materials for the cold wall include, for example, graphite plates such as TC1050 available from Momentive Performance Materials (Strongsville, Ohio). Other surfaces of the electronic chassis 100 may also be cold walls as required for thermal management. The layer 120 is an optional open cell conductive foam layer, such as aluminum foam available from ERG (Oakland, Calif.) or carbon foam available from Poco Graphite (Decatur, Tex.). Alternatively the heat transfer space may contain a series of fins attached to the cold wall of layer 110. A heat transfer medium, such as air or a liquid, flows from an external manifold and through the foam or fins to remove heat generated by electronics in the interior of the electronic chassis 100.

The next layers 130, 140 and 150 comprise wound braid or woven fabric sheets which may be a long continuous braid or woven fabric sheet having multiple sections impregnated with different matrix compositions or two or more shorter braid or fabric sheets each of which is impregnated with a different matrix composition. Suitable untreated fibers and fabrics include, for example, plain weave carbon fiber, such as Panex 30 available from Zoltec (Bridgeton, Mo.), or carbon fiber biaxial or triaxial braid available from A & P Technology (Cincinnati, Ohio). A suitable commercial braid prepreged with epoxy is Entropreg 916 available from Entropreg (Columbus, Ohio). Other suitable fabric materials include glass fibers, graphite fibers, ceramic fibers, mineral fibers (e.g. Basaltex, Basaltex-Flocart, Wevelgem, Belgium) and aramid fibers (Kevlar and Nomex from DuPont, Wilmington, Del.).

In order to apply the desired matrix material to the untreated braid or woven fabric sheets, an epoxy with a low viscosity to facilitate mixing is used. Suitable epoxies include, for example, Epon 862 resin and Epi-Kure W manufactured by Hexion Specialty Materials. Many other epoxy formulations are available, including many for specific applications, and are well known in the art. Other suitable thermoset materials for application of the desired matrix material include, for example, bismaleimide, phenolics, polyimides, vinyl esters, and cyanate esters.

In the embodiment shown in FIG. 2, the layer 130 is highly electrically conductive and/or magnetic with the purpose of providing electromagnetic shielding for electronic components within the chassis and preventing the escape of internally generated electromagnetic radiation from the chassis. The matrix composition for the layer 130 contains films or additives which are highly electrically conductive and/or magnetic. A suitable conductive film to be placed on the reinforced fabric prepreg is an aluminum foil or a nanopaper or a nickel nanostrand veil, any of which would be bound to adjacent layers of the prepreg. Suitable particulate materials include, for example: carbon nanofibers, such as PYROGRAFF III fibers available from Applied Sciences, Inc. (Cedarville, Ohio); carbon nanotubes, such as Nanocyl® 7000 available from Nanocyl (Sambreville, Belgium); nickel nanostrands available from Metal Matrix Composites (Magma, Utah); graphene platelets, such as Asbury Carbon 4827 available from Asbury Carbons (Asbury, N.J.); hollow carbon microspheres, available from Honeywell Aerospace (South Bend, Ind.); and short (milled or ⅛-inch) carbon fibers from E&L Enterprises (Oakdale, Tenn.) including those with Ni coatings, such as EF 2901 available from Sulzer Metco (Fort Saskatchewan, Canada). PYROGRAF III fibers are available in diameters of about 100 nm and aspect ratios of about 150:1 to about 1500:1. Such nanofibers can be heat treated in various ways to produce nanofibers with desired characteristics, including oxidation which facilitates dispersion of the nanofibers in the desired matrix material. If desired, nanofibers can be spun into highly oriented microfibers as described in U.S. Pat. No. 6,764,628, which is incorporated by reference herein in its entirety. Nanofibers can also be processed to form a dense layer, known as nanopaper, which has a low electrical resistivity (i.e. 0.3 ohm-cm). Suitable hollow carbon microspheres for incorporation into the layer 140 include, for example, those produced from phenolic using a high temperature process and having a bulk or tap density of about 0.155 g/cc and a diameter ranging from about 40 to 55 microns (Honeywell Aerospace, South Bend, Ind.). Glass microspheres having a bulk density of about 0.35 g/cc and an average diameter of about 85 microns can also be used (3M, Minneapolis, Minn.). Suitable nickel nanostrand metal matrix composites include those having diameters from about 50 nm to about 2000 nm with aspect ratios of about 50:1 to about 500:1 that are not aggregated. Such nickel nanostrand metal matrix composites are available in veils with areal densities of about 100 g/m$^2$, 200 g/m$^2$ (0.1 ohm-cm resistivity) and 300 g/m$^2$ (0.003 ohm-cm resistivity). Suitable nickel coated fibers, including those embedded axially in pellets, are commercially available for a number of thermoplastic resins from vendors such as Sulzer Metco (Fort Saskatchewan, Canada). These materials provide EMI shielding from about 60-80 dB and have a density of about 1.2-1.4 g/cc. Suitable metal coated nanofibers include silver and nickel coated nanofibers available commercially in thermoplastic masterbatches from NanoSperse (Akron, Ohio). Magnetic metal coatings, such as nickel, provide enhanced magnetic shielding.

In the embodiment shown in FIG. 2, the layer 140 contains a matrix composition which is used to optimize the mechanical properties and/or reduce the weight of the electronic chassis 100 with less or no emphasis on enhancing electromagnetic shielding. The matrix composition used to accomplish this differs from that used in the layers 130 and 150. The layer 140 of this embodiment is preferably continuously connected to the layer 130 and the layer 150. Suitable materials that can be utilized to impart desired mechanical properties to the electronic chassis 100 include, for example, short (milled to ⅛-inch) carbon fibers incorporated into the resin as additives. Hollow carbon or glass microspheres reduce density and thereby decrease weight. In some cases hollow microspheres can increase toughness by acting as energy dissipating defects. Carbon microspheres can contribute to electromagnetic shielding. If the spheres are nickel coated, they can also provide enhanced magnetic shielding.

In the embodiment shown in FIG. 2, the layer 150 is designed to provide a durable external surface and may be pigmented for cosmetic reasons. This layer may be comprised of matrix and additive materials designed to provide toughness or abrasion resistance. Suitable matrix and additive materials for these purposes include, for example rubber additives, such as carboxyl-terminated butadiene acrylonitrile copolymers, to enhance toughness in epoxy resins, and pigments which are available in a large range of colors for epoxy resins. Aluminum and graphite powders added to epoxy up to 10 vol. percent provide increased hardness and abrasion resistance and protection from sunlight. Such materials are available from West Systems (Bay City, Mich.). It may also be desirable to have fire retardants, which are well known in the art, concentrated in layers which are most directly exposed to fire. This could be the outside layer of the chassis for external fires and/or the inner most layer if fire is likely to originate in the interior.

Figure 3:
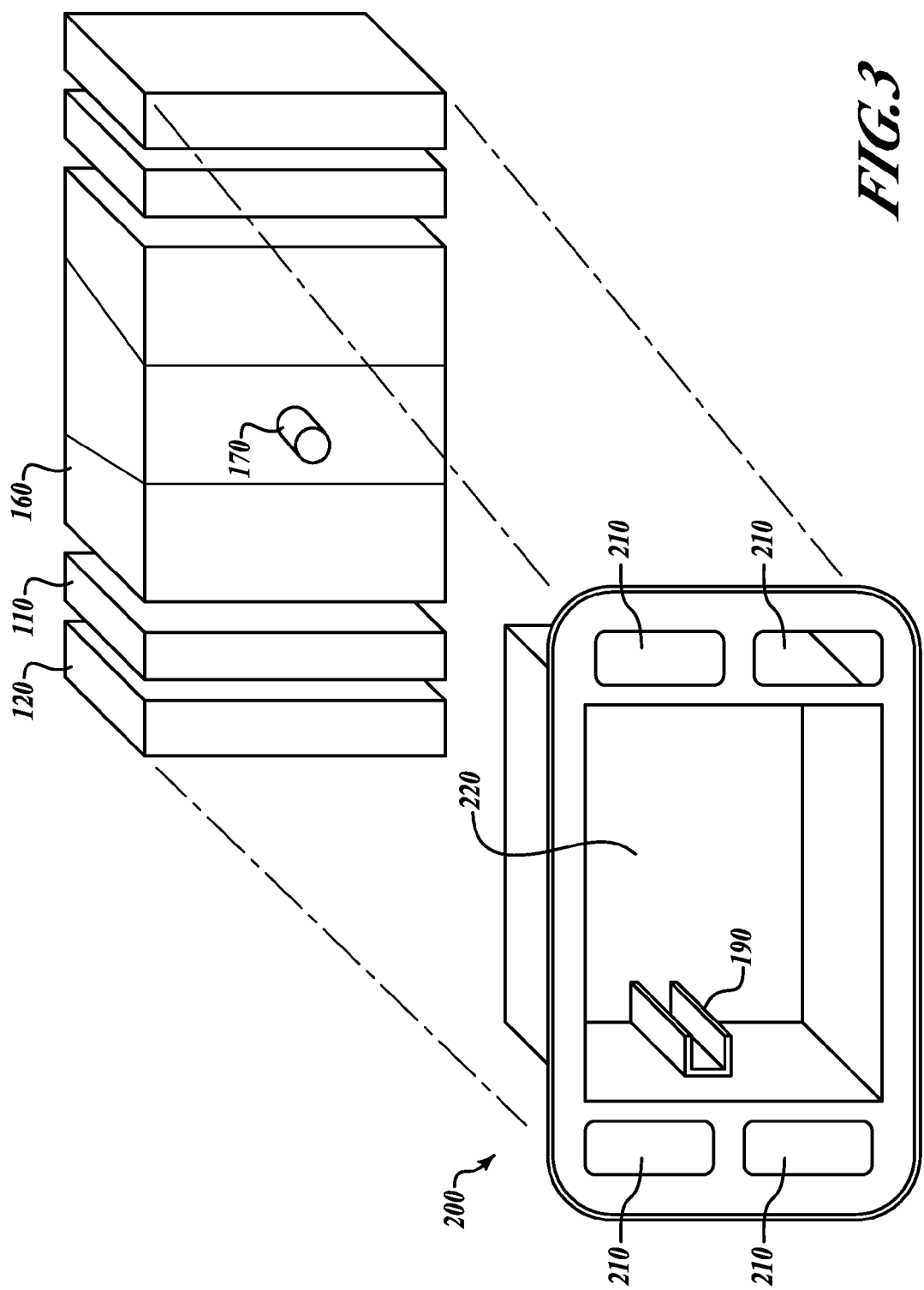
FIG. 3, top panel, shows a mandrel and several component layers prepositioned in relation to the mandrel, while FIG. 3, bottom panel, shows a frame for prepositioning the indicated component layers in relation to the mandrel.

Referring now to FIG. 3, top panel, the mandrel 160 and several component layers prepositioned in relation to the mandrel 160 are shown. As set forth above, the cold wall plate 110, the foam layer 120, the mandrel 160 and the rotating shaft 170 are shown. Prior to wrapping with the multimaterial prepreg sheet, the cold wall plate 110, the foam layer 120 and the mandrel 160 with the rotating shaft 170 are prepositioned within a frame 200 (shown in FIG. 3, bottom panel). The frame 200 includes air conduit openings 210 which facilitate the removal of heat generated by electronics in the interior of the electronic chassis 100 and a conduit 220 adapted for attachment of a door, which is occupied by the mandrel 160 in the illustrated embodiment. The frame 200 in the illustrated embodiment also includes the brackets 190 for anchoring line removable units (LRUs) or circuit boards. Depending on the depth of the frame, the brackets 190 are either attached to the frame 200 or to the cold wall plate 110. The frame can be fabricated from various materials, including, for example, stamped aluminum or composite sheet or injection molded composite compound.

Figure 4:
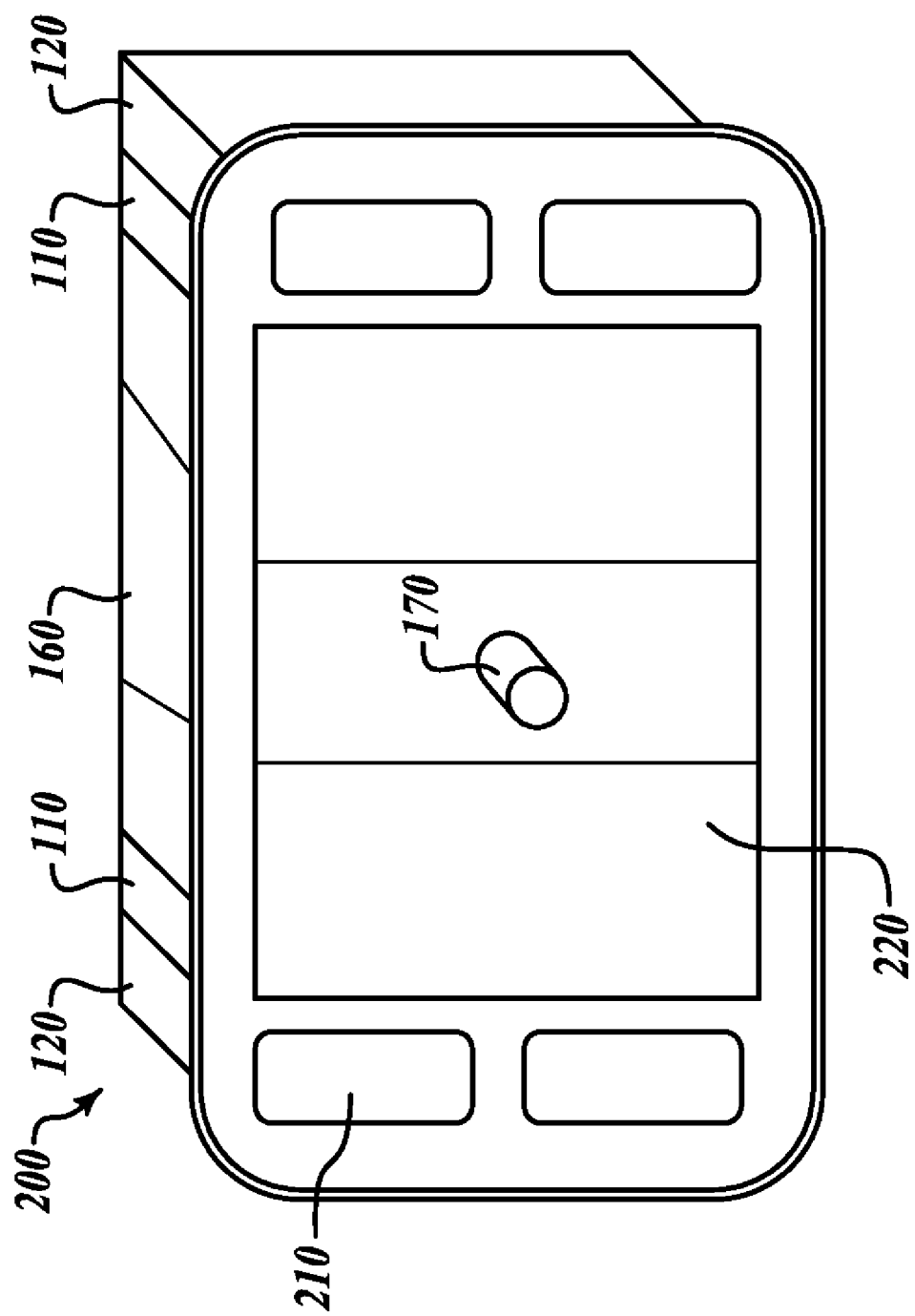
FIG. 4 shows a frame with a mandrel and various component layers prepositioned within the frame in relation to the mandrel.

Referring now to FIG. 4, the frame 200 with the mandrel 160 and various component layers prepositioned within the frame 200 in relation to the mandrel 160 is shown. As set forth above, the cold wall plate 110, the foam layer 120, the mandrel 160, the rotating shaft 170, the frame 200, the air conduit openings 210 and the conduit 220 are shown. The frame 200 with the mandrel 160 and the various prepositioned component layers are wrapped with the multimaterial prepreg sheet to complete preparation of the electronic housing 100.

Figure 5:
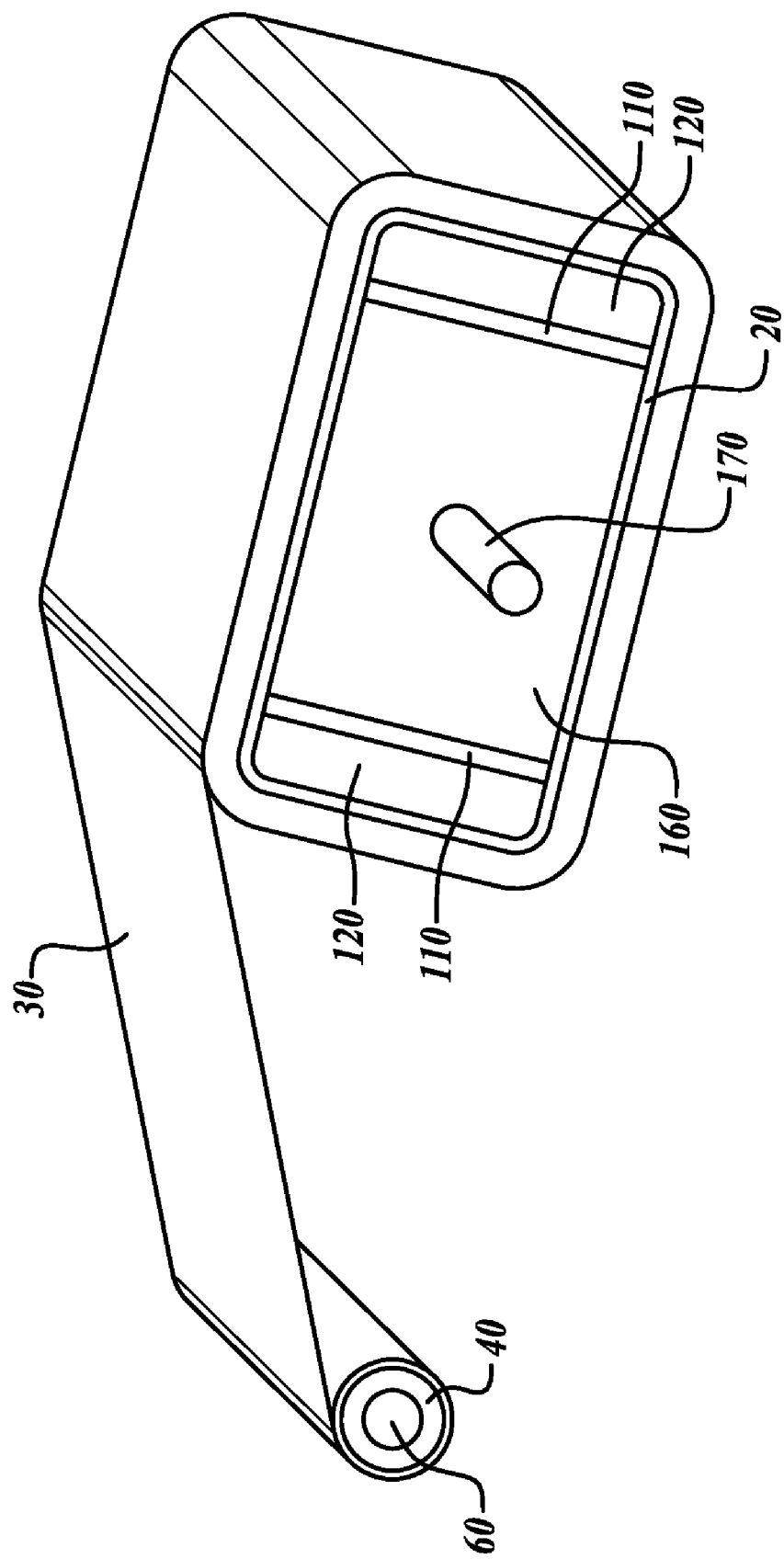
FIG. 5 is a perspective view illustrating the wrapping of a frame having a mandrel and various prepositioned component layers with a multimaterial prepreg sheet.

Referring now to FIG. 5, a perspective view of an embodiment of the present invention illustrating the wrapping of the mandrel 160 and the various prepositioned component layers with the multimaterial prepreg sheet to form the electronic chassis 100 is shown. As set forth above, the first section 20 treated with the first material, the second section 30 treated with the second material, the optional third section 40 treated with the optional third material, the roll 60, the cold wall plate 110, the foam layer 120, the mandrel 160 and the rotating shaft 170 are shown. The frame is not shown to allow better illustration of the internal wrap. The wrapping process may involve rotation of the mandrel 160 as shown. Alternatively, the mandrel may remain stationary and the feed roll assembly rotated in an orbit about the mandrel. In another alternative, the prepreg sheet can be formed continuously and immediately wrapped around the rotating mandrel in a single continuous process. If braid is used as the sheet material, the width of the braid being wrapped can be controlled during the wrapping process by the brake torque on the feed roll. Increasing the brake torque increases tension in the braid and decreases the width (increases length) of the braid and vice versa.

Figure 6:
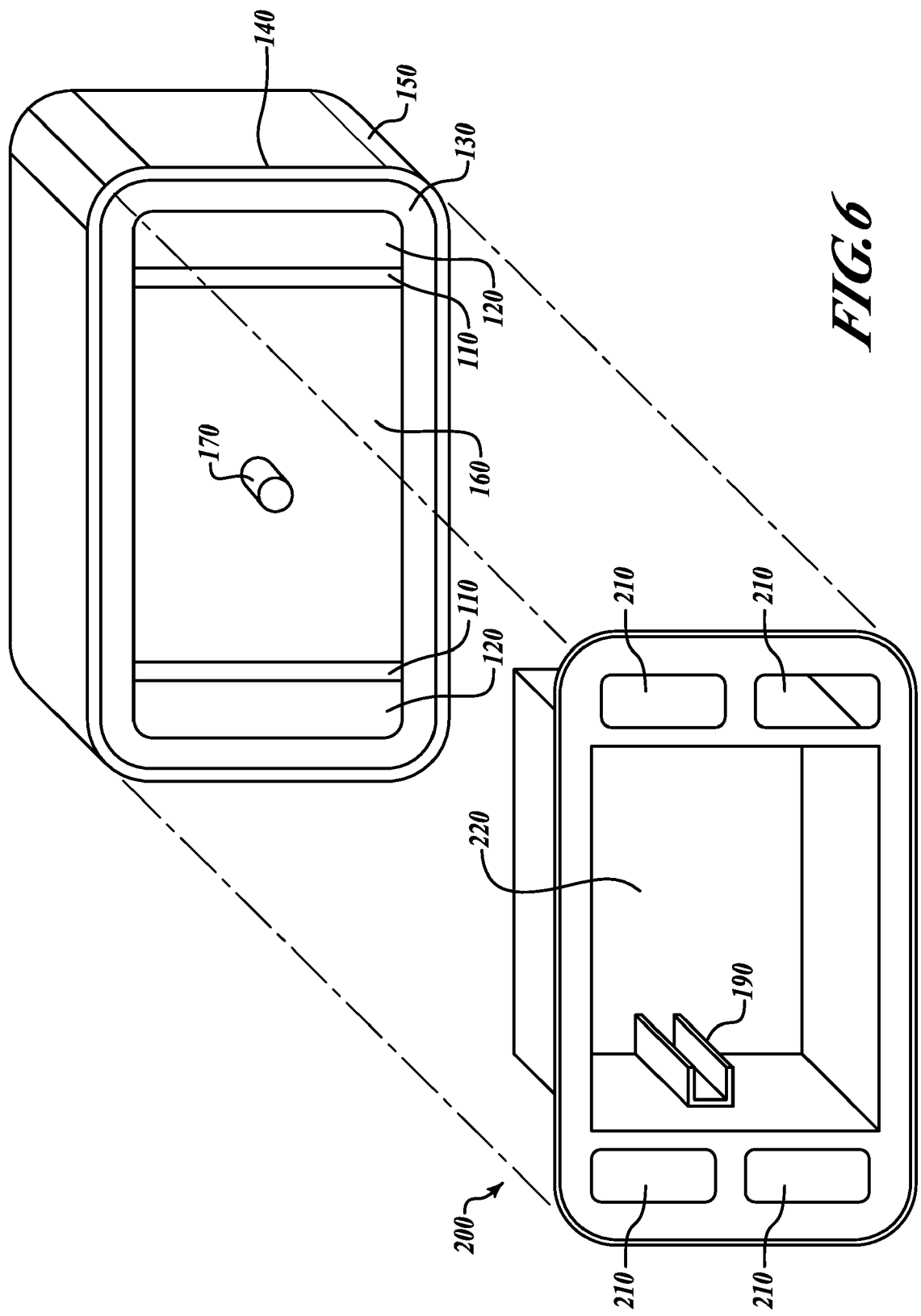
FIG. 6 is an exploded view of an assembled electronic housing made by wrapping a frame having a mandrel and various prepositioned component layers with a multimaterial prepreg sheet.

Referring now to FIG. 6, an exploded view of an embodiment of the electronic chassis 100 of the present invention made by wrapping the frame 200 having the mandrel 160 and the various prepositioned component layers with the multi-material prepreg sheet to form the electronic chassis 100 is shown. As set forth above, the assembled electronic chassis includes the cold wall plate 110, the foam layer 120, the mandrel 160, the bracket 190, the frame 200, the air conduit openings 210 and the conduit 220. As set forth above, the completed electronic chassis also includes the layer 130 which is highly electrically conductive and/or magnetic, the layer 140 which contains a matrix composition which is used to optimize the mechanical properties of the electronic chassis 100 and the layer 150 which is designed to provide a durable external surface for the electronic chassis 100.

Referring now to FIG. 7, an exploded view of an embodiment of the electronic chassis 100 of the present invention containing metal bands 230 for providing reinforcement and lightning protection to the electronic chassis. As set forth above, the completed electronic chassis 100 includes the cold wall plate 110, the foam layer 120, the frame 200 and the conduit 220. As set forth above, the completed electronic cassis also includes the layer 130 (not shown) which is highly electrically conductive and/or magnetic, the layer 140 (not shown) which contains a matrix composition which is used to optimize the mechanical properties of the electronic chassis and the layer 150 which is designed to provide a durable cosmetic external surface for the electronic cassis. As set forth above, the mandrel 160 has been removed from the completed electronic chassis 100 such that electronic components can be installed in the empty interior of the completed electronic chassis 100. The metal bands 230 are secured to the outside surface of the electronic chassis 100. The metal bands 230 can be fabricated from various materials, including, for example, aluminum strips. Brackets can be used to attach the electronic chassis 100 to any desired structure. For example, in the avionics field, brackets can be used to attach the electronic chassis 100 to the airframe of an aircraft, thereby providing lightning protection to the electronic components contained in the electronic chassis 100. The metal bands 230 provide further structural support and reinforcement for the electronic chassis 100.

Figure 9:
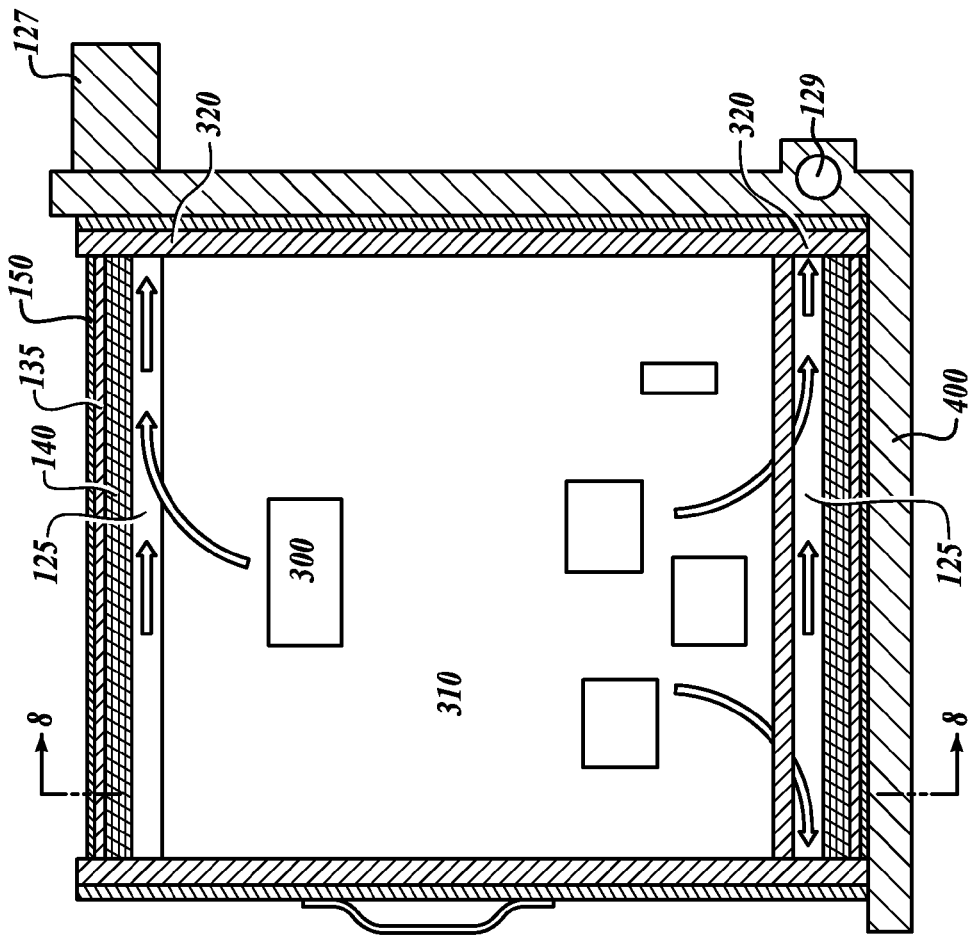
FIG. 9 is a cut-away view of the chassis shown in FIG. 8.
Figure 8:
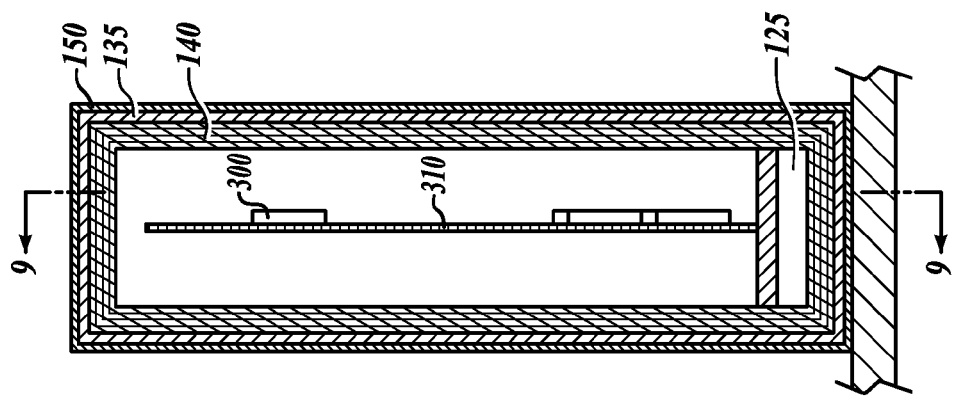
FIG. 8 is a sectional view of a chassis designed for conductive cooling and made by wrapping a mandrel.

FIG. 8 shows a sectional view and FIG. 9 a cut-away view of an alternative embodiment with heat transfer accomplished by highly conductive plates 125 on the top and bottom interior surface of the chassis. In this embodiment an aluminum foil layer 135 for EMI shielding is positioned between the outer protective layer 150 and the structural layer 140. As shown in the sectioned view, heat generated by electronic components 300 is conducted along the board 310, as indicated by the arrows, and through the rear or front of the chassis by the conductive plates 125. Heat flows through a highly conductive portal 320 in the chassis wall and is carried away by the external support frame 400 which itself may be cooled by a flowing fluid 129 or by free convection with fins 127 or by radiation, which is effective in a space environment.

It should be understood that the number and order of the layers, their compositions, and their functions may be altered to satisfy specific product requirements.

It should also be understood that the mandrel winding process may be used to produce hollow structures with functional layers for any number of applications, including athletic equipment, such as vaulting poles or golf clubs, and housings for mechanical and electronic components, such as avionics chassis.

The following example illustrates certain embodiments of the present invention, and is not to be construed as limiting the present disclosure.

EXAMPLE

Figure 10:
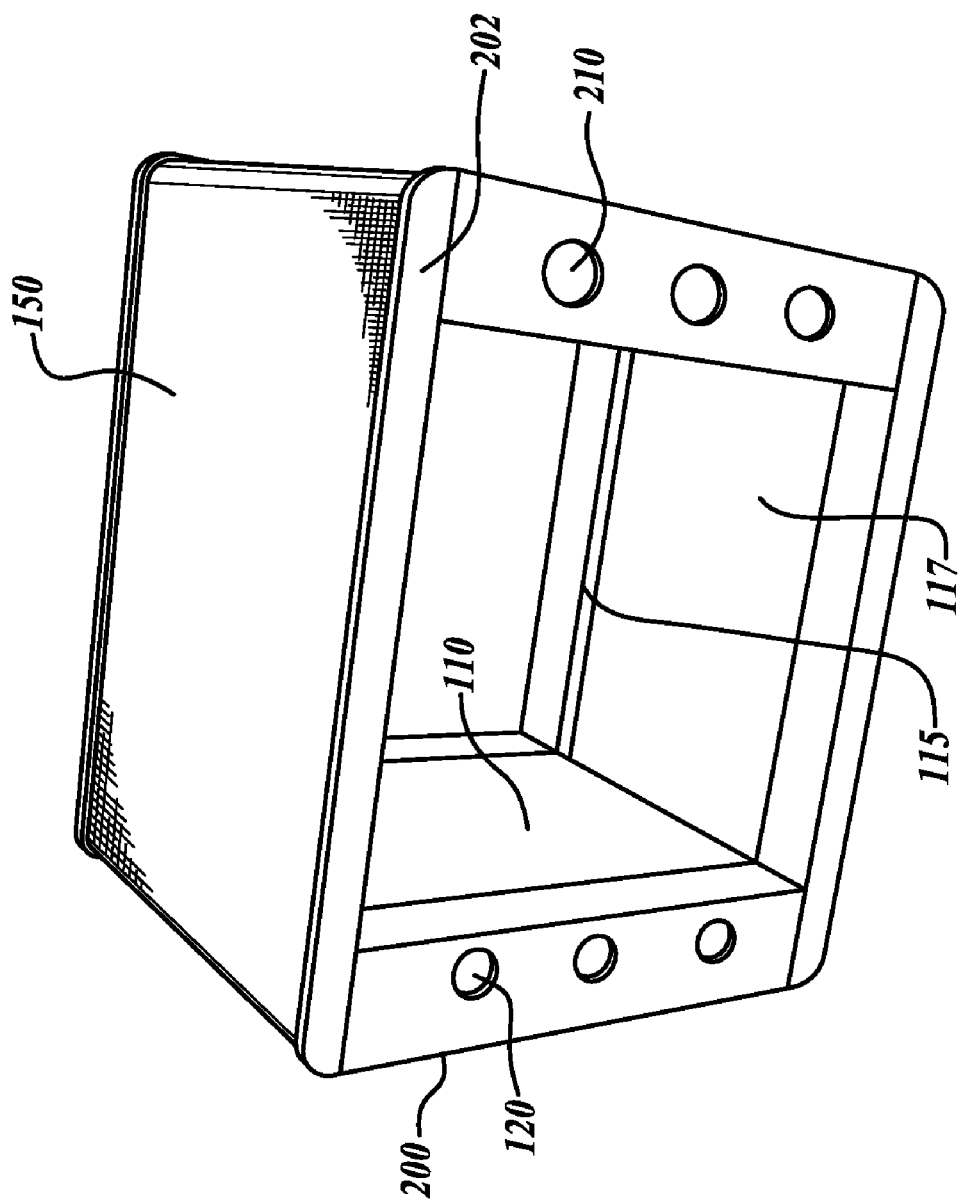
FIG. 10 is a perspective drawing of the quarter-scale prototype chassis described in the Example.

To illustrate the fabrication process, an approximately quarter-scale electronics chassis was fabricated using available materials. The fabricated chassis corresponds to the design shown in FIG. 7 and is shown in perspective in FIG. 10. The mandrel (not shown) was a 4"×4"×4" cube made of wood, which was cut into two approximately equal nearly rectangular sections. The cut was made at a slight angle to facilitate sliding removal of the mandrel sections following cure; the two sections were held together by two plates each secured by four screws. An aluminum frame 200 was made from sections of L-channel 0.0625-inch thick and extended along the mandrel by 0.5 inch and had thin (0.25 inch) top and bottom sections 202 which served as the boundary for the wrap layers 150. The dimensions on the face of the frame were selected to just cover the wrap 150 which was approximately 0.15-0.19 in thick. The two sides of the frame extended 0.75 inches and contained openings 210 for the introduction of cooling fluids. Two aluminum plates 0.0625-inch thick were placed on the sides of the mandrel to function as cold plates 110. The frame sections were secured by epoxy. Next two pieces of 0.5-inch thick aluminum foam 120 were placed adjacent to the cold plates to provide a channel for heat transfer fluid. The front and back frames 200 on the mandrel were identical. To provide a uniformly flat surface for wrapping the prepreg, the 0.0625-inch gaps 115 between the front and back frame plates on the bottom and top surfaces were filled with 0.0625-inch thick wood plate (not shown). Kapton sheet 117 was placed over the wood plates to prevent adhesion with the epoxy prepreg.

The first 4 layers of prepreg were prepared from Nomex braid which, when laid flat, measured approximately 0.012 inches thick (2 layers) and 6 inches wide. The braid was stretched to give the required 4-inch width for the wrap. A single wrap was approximately 17 inches long. The epoxy matrix material was Hexcel Epon 862 resin with Epikure W curative mixed in a 100:26 ratio by weight. The first layer was impregnated with epoxy compound containing 6.1 volume percent PYROGRAF III carbon nanofibers. The next three layers consisted of the epoxy with 19 vol percent hollow carbon microspheres. The epoxy compound, which included the additives, was applied to the Nomex braid at approximately 54 vol percent compound. The compound was applied by dispensing a liquid stream onto the braid and then using a squeegee to spread and impregnate the compound to cover the surface of the braid. The section of the braid being impregnated was positioned over a hot plate maintained at approximately 65° C. As each section of braid was impregnated with the compound, it was placed between two strips of Kapton film and wound up on a roll.

The impregnated braid was then applied to the mandrel assembly, which consisted of the frame 200 (face plates shown), the foam layer 120 (in this case aluminum foam panels) panels, the cold wall plate 110 (in this case aluminum), wood spacers 115, and a Kapton cover 117 between the wood and wound braid. The mandrel was rotated slowly and tension on the braid adjusted to give the required width to fit between the face plates. The nanofiber layer was applied first to provide EMI shielding. Three microsphere layers were applied next to give strong low density layers. The final wrap 105 was a commercial prepreg braid, Entrotech 916 which consists of 40% epoxy and 12K/tow carbon fiber. This prepreg was 0.085-inch thick (two layers) and 2.15-inch wide as supplied. The width of the braid was increased to 4 inches by stretching it widthwise with a corresponding decrease in length. A single layer of the outer protective layer 150 (in this case Entrotech braid) was applied to give the structure durability.

To provide pressure on the wrapped mandrel during cure, a silicone rubber strip was wrapped tightly around the outer Entrotech braid and held in place by a tightly wound thin elastic band. The wrapped structure was then cured in a hot air oven at 121° C. for four hours. After cooling, the cured chassis was easily removed from the mandrel. It had the desired light weight and stiffness properties.

While the preferred embodiment of the invention has been illustrated and described, as noted above, many changes can be made without departing from the spirit and scope of the invention. For example, openings may be cut in the wrap section of the device to allow access to the interior of the chassis. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. An electronic chassis comprising:
   a frame;
   one or more component layers wrapped around the frame; and
   a multimaterial prepreg sheet wrapped around the one or more component layers,
   wherein the multimaterial prepreg sheet comprises:
      a braid or woven fabric sheet of a predetermined length and width, wherein the fabric sheet comprises:
         a first section treated with a first material; and
         a second section treated with a second material; and
         optionally one or more additional sections treated with one or more additional materials,
      wherein each section of the prepreg sheet forms at least one layer around the frame,
      wherein the first and second material are different.

2. The electronic chassis of claim 1 wherein the braid or woven fabric sheet of a predetermined length and width is a plain weave carbon fiber, the first material provides shielding from electromagnetic radiation, the second material provides structural integrity and a third material provides a protective exterior surface.

3. The electronic chassis of claim 2 wherein the first material comprises an epoxy compound with nickel coated carbon fibers, the second material comprises an epoxy compound with hollow carbon microspheres and milled carbon fibers and the third material comprises a epoxy compound with a flame retardant and a pigment.

4. The electronic chassis of claim 1 wherein each section of the multimaterial prepreg sheet forms two to ten layers around the frame.

5. The electronic chassis of claim 1 wherein the frame contains one or more conduits for fluid flow, a conduit for attachment of a door and one or more brackets for anchoring circuit boards or line removable units.

6. The electronic chassis of claim 5 wherein the one or more components comprise a cold wall plate and a structured layer for heat transfer.

7. The electronic chassis of claim 6 wherein the bracket includes an anchor that extends through the cold wall plate.

8. The electronic chassis of claim 5 further comprising one or more metal bands for attaching the chassis to a desired structure.

\* \* \* \* \*